(12) United States Patent
Mallett et al.

(10) Patent No.: US 12,638,529 B2
(45) Date of Patent: May 26, 2026

(54) MAGNETIC RESONANCE SCANNER WITH PASSIVELY SHIELDED GRADIENT COIL

(71) Applicant: Siemens Healthcare Limited, Camberley (GB)

(72) Inventors: Michael Mallett, Faringdon (GB); Peter Dietz, Fürth (DE)

(73) Assignee: Siemens Healthcare Limited, Camberley (GB)

( * ) Notice: Subject to any disclaimer, the term of this patent is extended or adjusted under 35 U.S.C. 154(b) by 104 days.

(21) Appl. No.: 18/207,715

(22) Filed: Jun. 9, 2023

(65) Prior Publication Data

US 2024/0004013 A1 Jan. 4, 2024

(30) Foreign Application Priority Data

Jun. 29, 2022 (EP) .................................... 22275083

(51) Int. Cl.
| | |
|---|---|
| *G01R 33/421* | (2006.01) |
| *G01R 33/3815* | (2006.01) |
| *G01R 33/385* | (2006.01) |

(52) U.S. Cl.
CPC ..... *G01R 33/4215* (2013.01); *G01R 33/3815* (2013.01); *G01R 33/3856* (2013.01)

(58) Field of Classification Search
CPC ............ G01R 33/4215; G01R 33/3815; G01R 33/3856; G01R 33/3854; G01R 33/385; G01R 33/36
See application file for complete search history.

(56) References Cited

U.S. PATENT DOCUMENTS

| | | | | |
|---|---|---|---|---|
| 4,733,189 | A | * 3/1988 | Punchard | G01R 33/3875 324/318 |
| 5,255,837 | A | * 10/1993 | Xu | B23K 1/0008 228/179.1 |
| 5,289,128 | A | 2/1994 | DeMeester et al. | |
| 6,049,207 | A | 4/2000 | Petropoulos | |
| 7,777,489 | B2 | 8/2010 | Kawamoto | |
| 2002/0173429 | A1* | 11/2002 | Ehrenberg | H01F 6/06 505/211 |
| 2007/0296414 | A1 | 12/2007 | Huang | |
| 2008/0094062 | A1 | 4/2008 | Edelstein et al. | |
| 2008/0204024 | A1* | 8/2008 | Gao | G01R 33/385 324/318 |
| 2012/0283105 | A1* | 11/2012 | Ha | H10N 60/203 174/125.1 |
| 2013/0157865 | A1* | 6/2013 | Shen | G01R 33/56518 324/322 |

FOREIGN PATENT DOCUMENTS

| | | |
|---|---|---|
| EP | 0562708 B1 | 5/2003 |
| EP | 4300122 A1 | 1/2024 |

OTHER PUBLICATIONS

O. Heid et al., "A Novel Concept for Gradient Coil and Magnet Integration", Conference: ISMRM 13th Scientific Meeting & Exhibition, At: Miami Beach, FL Volume: Proceedings, 12 pgs., May 2005.

* cited by examiner

*Primary Examiner* — Daniel R Miller
(74) *Attorney, Agent, or Firm* — Banner & Witcoff, Ltd.

(57) ABSTRACT

A magnetic resonance 'MR' scanner utilizing a passive magnetic shielding technique. The scanner includes a gradient coil inductively coupled to a managed eddy current structure which establishes passive magnetic shielding for the gradient coil due to the inductive coupling.

10 Claims, 2 Drawing Sheets

Super conducting magnet coils

Primary (imaging) gradient coil          Active secondary (shielding) coil

100

102          106a          106

104

108          110          106b r z

Imaging volume

MAGNETIC RESONANCE SCANNER WITH PASSIVELY SHIELDED GRADIENT COIL

TECHNICAL FIELD

The present disclosure relates to a magnetic resonance scanner. In particular, the present disclosure concerns passive magnetic shielding for an otherwise unshielded (or at least not actively shielded) gradient coil.

BACKGROUND

Magnetic resonance (MR) scanners/imagers utilize a gradient coil to provide a magnetic field gradient from which an MR image can be formed. Detrimentally, the field produced by the gradient coil can couple to the scanner's superconducting magnet by eddy currents, negatively impacting image quality due to a lack of uniformity in the superconductor magnetic field. To address this, the magnet's radiation shield can provide some basic electromagnetic shielding, which can still impact imaging quality.

An actively shielded gradient coil has historically addressed the impact of eddy currents generated by rapidly switched magnetic gradient coils. The generation of the unwanted eddy currents in the radiation shield is reduced by introducing a secondary set of magnetic gradient coils, which create an opposing field gradient external to the primary set of magnetic gradient coils (when electric current is applied to both coils). The complete gradient coil structure (i.e., comprising the first and second set of coils) is designed to generate the desired magnetic field gradient within the imaging volume. In contrast, the magnetic field external to the gradient coil, usually within the volume of the static field generating magnet structure, is minimized. An example of such a system is shown in FIG. 1.

In some systems, any remaining, low amplitude eddy currents that are generated by incomplete magnetic field cancellation in the scanner are addressed by the mechanism of Eddy Current Compensation, wherein the shape of the switch on/off pulse of the applied magnetic field gradient from the gradient coils is modified to provide compensation of the finite rise time and decay time of the induced eddy currents. This process is commonly referred to as Pre-Emphasis. It is also applied to unshielded gradient coils to reduce the effect of the unwanted eddy current generation affecting the desired magnetic field.

However, mitigating eddy currents in this fashion results in a large apparatus and imposes limitations on the maximum patient bore of the scanner. Hence it is now highly desirable to develop an improved magnetic resonance scanner that does not suffer these or similar drawbacks.

SUMMARY

The example embodiments have been provided to address at least some of the difficulties encountered with current MR scanners, whether those difficulties have been specifically mentioned above or will otherwise be appreciated from the discussion herein.

In particular, the example embodiments address the issues of unwanted, contaminant magnetic field gradients from unwanted eddy currents and simultaneously seek to control eddy current decay time to reduce the impact of asymmetric eddy current generation and cancellation during image acquisition. The example embodiments represent a paradigm shift in how MR scanners may be magnetically shielded to avoid negative impacts on image quality due to a lack of magnetic uniformity in the generated magnetic fields.

Accordingly, in one aspect of the disclosure, a magnetic resonance 'MR' scanner comprises a gradient coil inductively coupled to a managed eddy current structure. Due to the inductive coupling, the managed eddy current control structure is configured to provide passive magnetic shielding for the gradient coil. Thus, the disclosure allows for using an unshielded gradient coil in an MR scanner, reducing space requirements inside the magnet bore and reducing the cost of the gradient coil itself. Also, such a structure may be incorporated invisibly into the magnet cryostat. It may further advantageously be arranged as part of the scanner's cryogenic heat transport system to simultaneously provide the benefits of eddy current control and cryogenic thermal transport.

The managed eddy current structure is a structure that controls a direction in which generated eddy currents flow; it should go without saying that the managed eddy current structure is therefore conductive. The managed eddy current structure may be formed of conducting control surfaces configured to direct the flow of eddy currents. Preferably, the managed eddy current structure is integrated into a mechanical support structure configured to maintain a position of the managed eddy current structure within a magnet assembly. In one embodiment, the managed eddy current structure is positioned within a cryogen vessel of the MR scanner. However, the managed eddy current structure may also be positioned externally to the cryogen vessel, i. e. outside of the cryogen vessel. It is also conceivable that the managed eddy current structure is implemented in a "dry system" without a cryogen vessel. Such "dry systems" may be characterized by very little or no amounts of cryogen in direct contact with the magnet coils.

The managed eddy current structure may be formed of conducting control surfaces that direct the flow of eddy currents. Preferably, the control surfaces are designed in conjunction with a design of the (otherwise unshielded) gradient coil such that the eddy currents occur in preferential locations to provide cancellation of the magnetic field external to conducting surfaces of the MR scanner. For example, the shape of the managed eddy current structure corresponds to the shape of the gradient coil, such that the eddy currents stimulated in the structure create a magnetic field to cancel the magnetic field created by providing electrical power (current) to the gradient coil.

Eddy currents generated in the managed eddy current structure flow in opposition to the AC field generated by the gradient coils, which reduces the penetration of the AC magnetic field outside the managed eddy current structure. In contrast, the structure simultaneously suppresses the ability of eddy currents to flow in non-desirable directions, which does not combat the field generated by the gradient coils.

To aid explanation, the eddy current structure may initially be considered a mere cylinder. However, a uniform cylinder would have the disadvantage that the eddy currents can create extra magnetic field contributions, which are disadvantageous in various locations of the MR scanner. Such magnetic field contributions from a pure cylinder are analogous to the field contributions from (unmanaged) eddy currents that arise in conducting surfaces of prior art scanners and are mitigated by actively shielded gradient coils.

Suitably, instead of a continuous cylinder, the managed eddy current structure may comprise a plurality of isolated conductive loops (making up the cylinder surface) to protect the superconducting magnet coils from the AC stray field by generating shielding eddy currents near the vicinity of the magnet coils. These loops are conductive surfaces optimized to the shape of the AC magnetic field generated by a (preferably individual) gradient coil; the loops control the direction of flow of the eddy currents. Subdividing the control surface into a series of isolated loops further improves the specificity of the present techniques, improving the external AC field shielding effect and the internal field refinement effect.

Put another way; the conductive loops may form appropriate closed shapes on the surface of a cylinder. The conductive loops are suitably shaped to create both a magnetic shielding effect in the location of the superconducting magnet coils (reducing the magnitude of the rate of change of magnetic flux created by the AC magnetic field from the gradient coil) by creating AC magnetic fields of opposite polarity to those created by the gradient coil, thus reducing the overall effect by superposition of magnetic fields and simultaneously creating beneficial magnetic fields in the imaging volume of the MR scanner. The loops are preferentially manufactured from a high conductivity material with the preferred cross-sectional area between ~1 mm2 to ~1 cm2 (although larger or smaller cross-sectional areas may also be used). The cross-sectional areas may be constant around each loop, or preferentially the cross-sectional area may vary around the loop to generate by induction an appropriate current density and provide the necessary degrees of design freedom to achieve the desired goals of external AC field minimization and internal field refinement. The conductive loops (which, as a reminder, control the direction of flow of the eddy currents) preferentially form a plurality of isolated loops forming a number of concentric loop structures on the surface of a cylinder; the number of concentric loop features is determined by a suitable design algorithm taking into account the design of the gradient coil itself and the magnetic fields generated thereby.

Suitably, in a corresponding aspect of the disclosure, there is also provided a method of manufacture of the aforementioned managed eddy current structure (110) by one, or a combination, of cutting directed eddy current pathways in a sheet of high conductivity material, and subsequently manipulating the sheet of high conductivity material into a shape to fit the desired location in the MR scanner, or bending a conducting wire into closed loops and closing the loops by one of soldering, brazing or welding.

BRIEF DESCRIPTION OF THE DRAWINGS

For a better understanding of the present disclosure, reference will now be made by way of example only to the accompanying drawings, in which.

4

DETAILED DESCRIPTION

Figure 1:
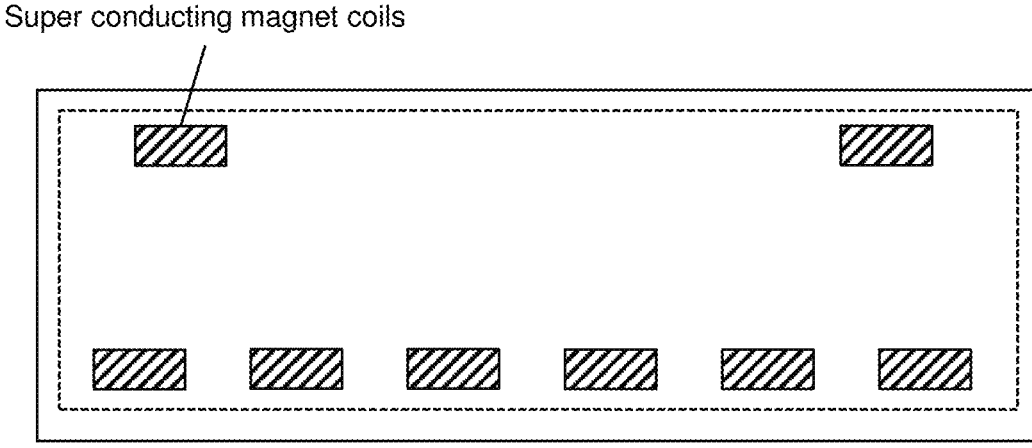
FIG. 1 shows a schematic cross-section (top half lengthways) of a magnetic resonance scanner with an actively shielded gradient coil.
Figure 1:
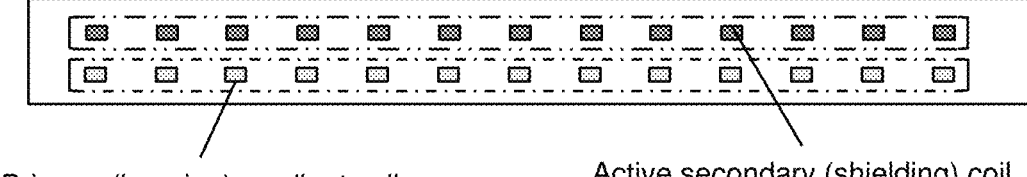
Figure 2:
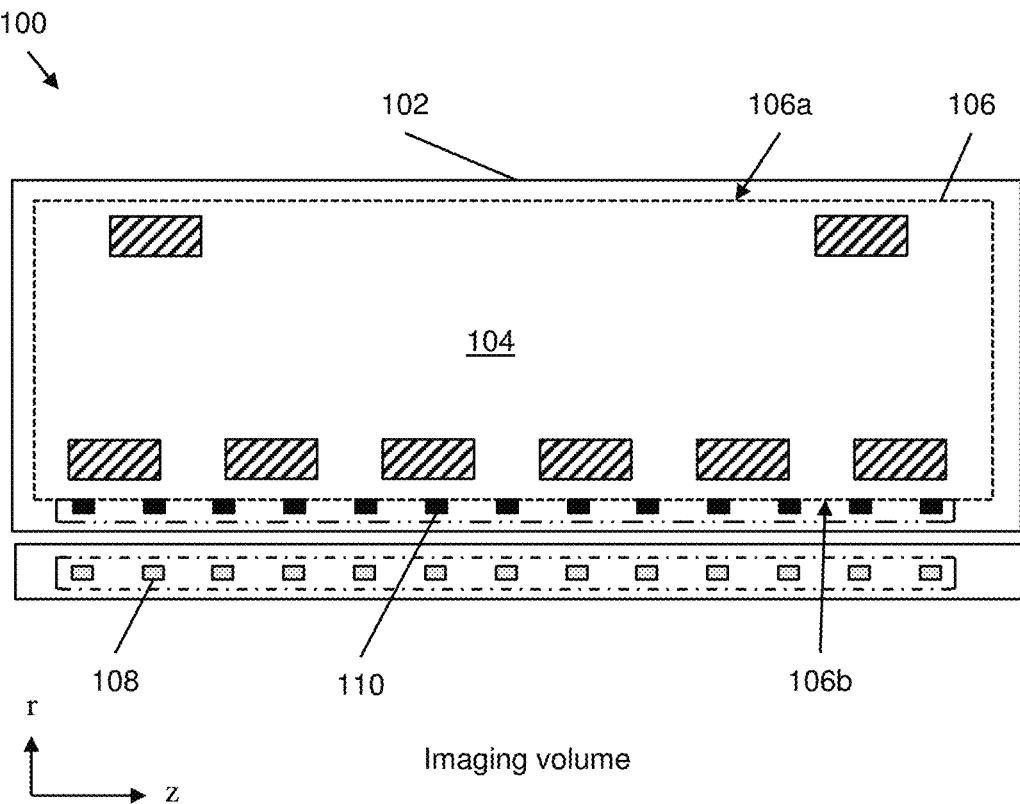
FIG. 2 shows a schematic cross-section (top half lengthways) of an example magnetic resonance scanner with a passively shielded gradient coil.

FIG. 2 shows a schematic cross-section of an example magnetic resonance scanner 100, which utilizes an entirely different approach to gradient coil shielding compared to existing MR scanner designs. In contrast to designs that use an active secondary coil to counteract the field produced by the primary (imaging) gradient coil (e.g., FIG. 1), the present scanner design uses a passive approach to magnetic shielding (i.e., the shield is not electrically connected to a power source for the scanner 100).

Suitably, the example MR scanner 100 comprises a superconducting magnet assembly 102 comprising magnet windings housed within a cryostat 104 with thermal radiation shield 106 (more specifically, the radiation shield may be considered to comprise an inner cold shield 106a and outer cold shield 106b).

The scanner 100 also comprises a gradient coil 108, generating magnetic field gradients for MR imaging. That is, scanner 100 comprises a gradient coil analogous to the primary coil of FIG. 1, as will be appreciated by those in the art.

To achieve passive shielding, the scanner 100 comprises a managed eddy current structure 110, formed of conducting control surfaces that direct the flow of eddy currents. The eddy currents are generated in the managed eddy current structure via inductive coupling to the gradient coil 108.

Suitably, the control surfaces are designed in conjunction with the design of the (otherwise unshielded) gradient coil 108 such that the eddy currents occur in preferential locations to provide cancellation of the magnetic field external to conducting surfaces of the MR scanner 100. In this way, the magnitude of switched magnetic gradient fields in the vicinity of the superconducting surfaces is reduced. Put another way, the shape of the managed eddy current structure 110 corresponds to the shape of the gradient coil 108, such that the eddy currents stimulated in the structure 110 create a magnetic field to cancel the magnetic field created by providing electrical power (current) to the gradient coil 108.

In addition, the control surfaces of the managed eddy current structure 110 may be suitably shaped to generate useful magnetic field gradients within the imaging volume and/or minimize the generation of contaminant magnetic field gradients within the imaging volume.

Advantageously, the managed eddy current structure 110 behaves similarly to the secondary coils of an actively shielded gradient coil but without the need for direct electrical power. Thus, the costs of building the scanner 100 may be reduced because the gradient coil structure no longer needs to be provided with a secondary coil. Also, the managed eddy current structure 110 may be suitably arranged elsewhere within the scanner apparatus 100 to reduce the overall size of the scanner 100.

Figure 4:
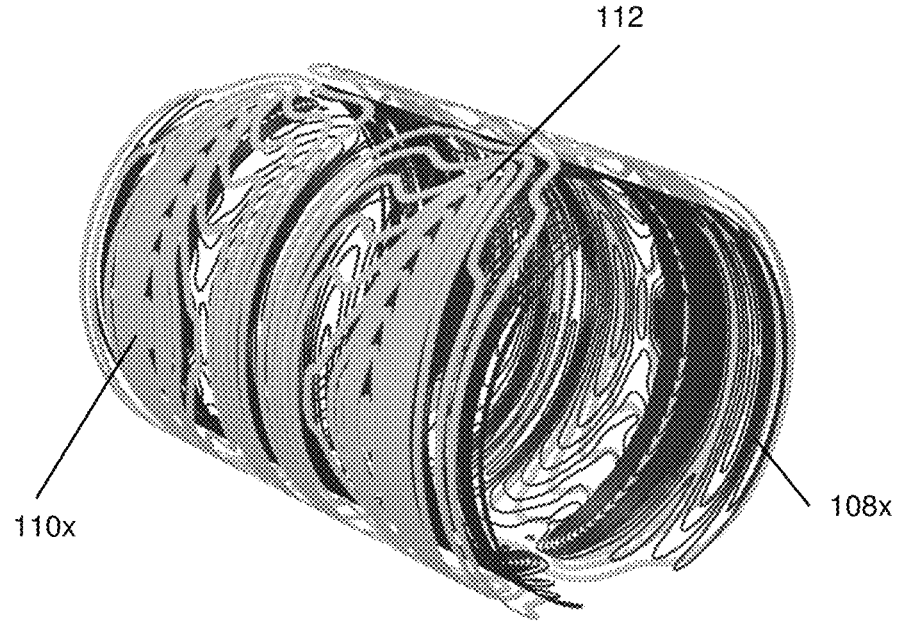
FIG. 4 shows an example X eddy control surface (grey) for coupling to an X gradient coil to minimize stray field at the superconducting coils.

Suitably, the managed eddy current structure 110 may be designed to address each of the three orthogonal gradient axes of the MR scanner 100 individually, where a separate eddy current control surface is designed to work with each (of X, Y & Z) individual (unshielded) gradient coil (commonly referred to as GX, Gy, Gz); as in, e.g., FIG. 4, which shows Gx 108x coupled to a first control surface 110x. Put another way, where the scanner 100 comprises multiple gradient coils corresponding to orthogonal imaging axes, the managed eddy current structure 110 may comprise an eddy control surface corresponding to each of the gradient coils present in the scanner. For example, for a scanner with first (Gx), second (Gy), and third (Gz) gradient coils, the managed eddy current structure may suitably comprise a first, a second, and a third eddy current control surface corresponding respectively to the first, second and third gradient coils.

In more detail, it will be understood that each of the three gradient coils acts independently of each other to create a desired time history of magnetic field variation imposed on the subject volume. Suitably, the individual gradient coils may be coupled to separate eddy current control surfaces (forming the managed eddy current structure 100) to ensure adequate external shielding and internal field improvement. The eddy current control surfaces are suitably designed in conjunction with the individual gradient coils to achieve these requirements. Preferably, each of the three control surfaces of the managed eddy current structure (corresponding to the three gradient coils) is isolated from each other to provide independent behavior.

The coupling (preferably 1-to-1) of the control surfaces and gradient coils ensures that eddy currents induced in a first one of the control surfaces by the second or third gradient coil are minimal. For example, eddy currents generated in a first control surface (corresponding to coil Gx) by second gradient coil Gy are minimal due to the lack of closed loops of the first control surface being inductively coupled to the gradient coil design of Gy. Any small eddy currents generated will be constrained to volumes not much larger than the cross-sectional area of the control surface loops and will therefore be both small in magnitude and minimal in external effect. The effect of these contaminant eddy currents will be minimal and localized in nature and will have little impact on image quality or power deposition.

Figure 3:
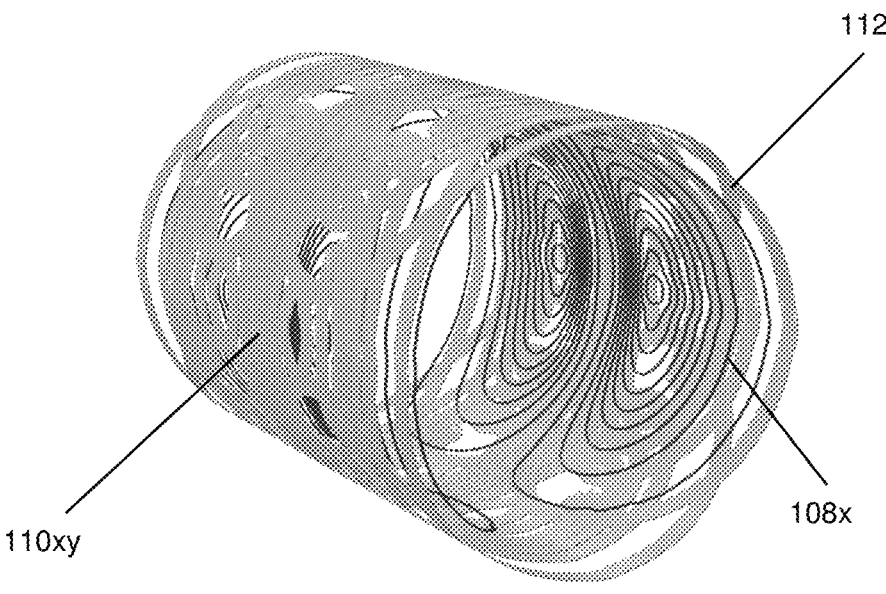
FIG. 3 shows an example X-Y eddy control surface (grey) for coupling to suitable X-Y gradient coils (only the X coil is shown in black, with the ith Y coil omitted for clarity) to minimize stray field at the radius of the inner magnet coils.

Alternatively, the individual eddy current control surfaces designed for each of the axes can be combined to provide a single structure 110 which works efficiently for each individual gradient axis; as in, e.g., FIG. 3, which shows a combined XY control surface 110xy (though only Gx 108x is shown for clarity, and it will be appreciated that the coil is shown different to that in FIG. 4 as not all gradient coils are the same). The shape of the individual control surfaces generates a preferred eddy current path. When the individual conducting paths are combined into a single structure, there are still preferred eddy current pathways for each gradient axis individually, even though there are multiple connections between different parts of the complete structure. It will also be appreciated that other combinations are also possible, for example, the managed eddy current structure 110 comprising one control surface structure corresponding to one of the gradient coils and one control surface structure corresponding to one or more other gradient coils (e.g., the other two coils in an X Y Z coil scanner).

In this example, the eddy current control surfaces corresponding to the first, second, and third gradient coils (GX, Gy, Gz) may be designed as a single surface with conjoined closed loops. This example has the benefit of reducing the radial space required by the control surfaces (i.e., one conjoined control surface takes up less space than three separate surfaces). The nature of the inductive coupling between each individual gradient coil and the one control surface will allow for eddy current generation along the preferred closed-loop pathways associated with an individual gradient coil/control surface pair (the primary loop pathways). Still, it will reduce the magnitude of eddy currents generated in non-preferential loop pathways (the secondary loop pathways inevitably created by the coalescence of the three control surfaces together) by low inductive coupling between an individual gradient coil and a secondary loop pathway.

FIGS. 3 and 4 show that the control surfaces of the managed eddy current structure 110 may be formed from a plurality of isolated conducting loops 112. Some of these loops may be connected by passive electrical components—including, for example, diodes, resistors, inductors, and/or capacitors—and some may be connected by active electrical components—including, e.g., switches and/or transistors—to preferentially direct eddy currents generated during operation. For example, a first isolated conducting loop and a second isolated conducting loop may be connected by one or more passive electrical components, while a third isolated conducting loop and a fourth isolated conducting loop may be connected by one or more active electrical components. In this way, the location/direction of the induced eddy currents may be passively and/or actively preferentially redirected when certain conditions of the electrical environment generated by the induced eddy currents are met to create a preferential distribution of current distribution during the application of the imaging sequence gradient switching. It will be appreciated that for a given managed eddy current structure 110, both active and passive connections may be present, only one type of connection may be utilized, or indeed no additional connections between loops may be needed. For example, power transistors (active) controlled by an external control system can be switched from an open to a closed state to ensure that eddy current pathways are established in preferred directions during the gradient coil/control surface structure operation. Similarly, diode (passive) elements can be introduced to ensure that only eddy currents above a particular magnitude can flow through parts of the structure.

In one example, the managed eddy current structure 110 comprising such loops may be formed by cutting the eddy current pathways from a substantially flat sheet of material, and subsequently manipulating the cut sheet into the desired shape; e.g., rolling the cut sheet into a cylinder. In another example, the loops may be formed by bending wire into the appropriate loop shapes and closing the loops by one of soldering, brazing, or welding. In another example, the structure 110 could be formed from a series of sections of tape of suitable material joined together.

The control surfaces of the managed eddy current structure 110 are suitably formed from a high electrical conductivity material, which gives the benefits of low dispersion eddy current cancellation by gradient pulse switching. Here high conductivity preferentially means that the conducting loops 112 forming the managed eddy structure 110 have an electrical conductivity one or two orders of magnitude higher than is achieved by structural Aluminium alloys used elsewhere in the scanner 100.

As such, it is preferred that the material has high purity—for example, high-purity Aluminium, Copper, or superconducting material such as Niobium or HTS—but the advantages of directed eddy current pathways can also benefit from using lower conductivity materials, for example, Aluminium alloys commonly used for the manufacture of radiation shields. High conductivity Aluminium alloy is preferred due to already being used in the design of the radiation shield within the superconducting magnet cryostat.

Advantageously, high conductivity materials have reduced electrical resistivity, which reduces the amount of unwanted heat being deposited into the structure 110, thereby reducing any additional heat load on the cryogenic system. Also, high conductivity yields very long eddy current decay times, which in turn leads to reducing the difference of unwanted eddy currents remaining in the conducting surface before and after a gradient pulse has been applied; thus, the switch on and switch off eddy currents are more closely similar and provide mutual cancellation, unlike short time eddy currents which are not mutually canceling. Furthermore, the skin depth of the induced eddy currents reduces as the conductivity of the material increases, which allows very thin conducting structures to be used while ensuring that the switched magnetic field is completely compensated for by ensuring the material thickness is multiple times the skin depth, allowing for effectively zero field penetration through the conducting structure which also allowing for smaller scanners overall.

However, high-conductivity materials generally have lower mechanical stiffness than their alloyed counterparts. As such, it is preferred that the managed eddy current structure 110 is integrated into a mechanical support structure to ensure that the directed eddy current control structure is rigidly fixed within the magnet assembly 102. For example, either at the 50K or 4K stages or potentially at an intermediate temperature if the eddy current control structure bridges between multiple internal magnet assemblies.

Suitably, in one example, the managed eddy current structure 110 is arranged within the cryostat 104 and may be integrated into the magnet cold mass structure, with the magnet structure providing improved mechanical support. The conducting material of the control surfaces benefits from cryostat cooling, enhancing its conducting properties to achieve high conductivity.

In another example, the managed eddy current structure 110 is arranged as part of the cryogenic heat transport system for the scanner 100, thereby providing the benefits of eddy current control and cryogenic thermal transport simultaneously (e.g., by providing a natural thermal pathway to extract the energy deposited in the structure due to the rapidly varying magnetic gradient fields). In particular, the managed eddy current structure 110 may be configured as an integral part of the radiation shield 106, for example, as part of the inner cold shield 106a, or by being attached to the 1st stage of the cold head (not shown). It is noted that high conductivity is typically partnered with very low surface emissivity properties, meaning that the high-conductivity materials proposed for the passive shield are particularly suited for this purpose.

It will be appreciated that the exact size, shape, thickness, etc., of the closed loops to be manufactured may be suitably determined by computer simulations modeling the magnetic field induced by the gradient coil 108 at a proposed location (e.g., radius) within the scanner 100, modeling suitable eddy current pathways (i.e., the control surfaces) to cancel that magnetic field, and determining a suitably managed eddy current control structure 110 comprising those eddy current pathways to cancel the magnetic field induced by the gradient coil 108.

Moreover, the discussed passive shielding allows for compensation by the design of the different field harmonics created by the gradient coil conductors being present on a separate radius to the eddy current surfaces. The field distributions generated by components at different distances from a sample point can be minimized by design optimization of either the eddy current surface or both the eddy current surface and the gradient coil simultaneously.

In summary, exemplary embodiments of an improved MR scanner utilizing a passive magnetic shielding technique have been described. It will be appreciated that the described scanner may be manufactured industrially and that the exemplary embodiments are convenient to manufacture. An industrial application of the example embodiments will be clear from the discussion herein.

Although preferred embodiment(s) of the present disclosure have been shown and described, it will be appreciated by those skilled in the art that changes may be made without departing from the scope of the disclosure as defined in the claims.

Attention is directed to all papers and documents which are filed concurrently with or previous to this specification in connection with this application and which are open to public inspection with this specification, and the contents of all such papers and documents are incorporated herein by reference.

All of the features disclosed in this specification, and/or all of the steps of any method or process so disclosed, may be combined in any combination, except combinations where at least some of such features and/or steps are mutually exclusive.

Each feature disclosed in this specification may be replaced by alternative features serving the same, equivalent or similar purpose, unless expressly stated otherwise. Thus, unless expressly stated otherwise, each feature disclosed is one example only of a generic series of equivalent or similar features.

The disclosure is not restricted to the details of the foregoing embodiment(s). The disclosure extends to any novel one, or any novel combination, of the features disclosed in this specification or to any novel one, or any novel combination, of the steps of any method or process so disclosed.

The invention claimed is:

1. A magnetic resonance 'MR' scanner comprising:
a gradient coil; and
a managed eddy current structure inductively coupled to the gradient coil,
wherein the managed eddy current structure is formed from a high electrical conductivity non-superconducting material and provides passive magnetic shielding for the gradient coil as a result of the inductive coupling,
wherein the managed eddy current structure comprises a plurality of isolated conducting loops that are discrete conductive paths rather than continuous coil windings, and
wherein the managed eddy current structure further comprises one or more passive electrical components or active electrical components that connect at least one of the plurality of isolated conducting loops to at least one other of the plurality of isolated conducting loops to control a location or direction of induced eddy currents to create a preferential current distribution during application of an imaging sequence gradient switching.

2. The MR scanner of claim 1, wherein the managed eddy current structure is arranged within a cryostat of the MR scanner.

3. The MR scanner of claim 1, wherein the managed eddy current structure is arranged as part of a cryogenic heat transport system for the MR scanner.

4. The MR scanner of claim 3, wherein the managed eddy current structure is arranged as part of a radiation shield for a superconducting magnet of the MR scanner.

5. The MR scanner of claim 1, wherein the managed eddy current structure comprises aluminium.

6. The MR scanner of claim 1, wherein the managed eddy current structure comprises copper.

7. The MR scanner of claim 1, wherein the gradient coil is one of a plurality of gradient coils configured to generate magnetic field gradients along orthogonal imaging axes of the MR scanner, and the managed eddy current structure is configured to provide magnetic shielding for the plurality of gradient coils in combination.

8. The MR scanner of claim 1, wherein the gradient coil is one of a plurality of gradient coils configured to generate magnetic field gradients along orthogonal imaging axes of the MR scanner, and the managed eddy current structure comprises eddy current control surfaces corresponding to each of the plurality of gradient coils separately.

9. A method of manufacture of a managed eddy current structure for use in magnetic resonance 'MR' scanner having a gradient coil inductively coupled to a managed eddy current structure being formed from a high-conductivity non-superconducting material and configured to provide passive magnetic shielding for the gradient coil as a result of the inductive coupling, the method comprising:

cutting directed eddy current pathways defining a plurality of isolated conducting loops in a sheet of the high-conductivity non-superconducting material; and subsequently manipulating the sheet into a shape to fit a desired location in the MR scanner, wherein the managed eddy current structure further comprises one or more passive or active electrical components that interconnect at least some of the isolated conducting loops to control a location or direction of induced eddy currents.

10. A method of manufacture of a managed eddy current structure for a magnetic resonance 'MR' scanner having a gradient coil inductively coupled to a managed eddy current structure, the managed eddy current structure being formed from a high-conductivity non-superconducting material and configured to provide passive magnetic shielding for the gradient coil as a result of the inductive coupling, the method comprising:

bending a conducting wire into a plurality of isolated closed loops; and closing the loops by one of soldering, brazing or welding, wherein the managed eddy current structure further comprises one or more passive or active electrical components that interconnect at least some of the isolated conducting loops to control a location or direction of induced eddy currents.

* * * * *